United States Patent
Wilkins (12)

(10) Patent No.: US 10,087,518 B2
(45) Date of Patent: Oct. 2, 2018

(54) ELECTRICALLY RECONFIGURABLE DEPOSITION MASKS

(71) Applicant: The Boeing Company, Chicago, IL (US)

(72) Inventor: Donald Frank Wilkins, O'Fallon, MO (US)

(73) Assignee: The Boeing Company, Chicago, IL (US)

( * ) Notice: Subject to any disclaimer, the term of this patent is extended or adjusted under 35 U.S.C. 154(b) by 618 days.

(21) Appl. No.: 14/458,752

(22) Filed: Aug. 13, 2014

(65) Prior Publication Data

US 2016/0047035 A1 Feb. 18, 2016

(51) Int. Cl.
*C23C 14/04* (2006.01)
*C23C 16/04* (2006.01)
*C23C 14/54* (2006.01)

(52) U.S. Cl.
CPC ............ *C23C 16/042* (2013.01); *C23C 14/04* (2013.01); *C23C 14/042* (2013.01); *C23C 14/542* (2013.01); *C23C 16/04* (2013.01)

(58) Field of Classification Search
CPC ....... C30B 25/04; C23C 4/0005; C23C 14/04; C23C 14/042; C23C 14/044; C23C 16/04; C23C 16/042
USPC .................................................. 118/720, 721
See application file for complete search history.

(56) References Cited

U.S. PATENT DOCUMENTS

| | | | | |
|---|---|---|---|---|
| 3,636,916 A | * | 1/1972 | Thelen | C23C 14/548 118/690 |
| 5,338,424 A | * | 8/1994 | Drimer | C23C 14/042 204/298.11 |
| 2001/0028204 A1 | * | 10/2001 | Rueger | F02D 41/2096 310/316.03 |
| 2001/0030306 A1 | * | 10/2001 | Moler | H02N 2/043 251/129.06 |
| 2003/0038112 A1 | * | 2/2003 | Liu | C23C 16/509 216/60 |
| 2003/0094133 A1 | * | 5/2003 | Yoshidome | C23C 16/4481 118/715 |
| 2004/0142625 A1 | * | 7/2004 | Freeman | C23C 14/042 445/60 |
| 2005/0239291 A1 | * | 10/2005 | Alba | G03F 7/0015 438/720 |

* cited by examiner

*Primary Examiner* — Aiden Lee
(74) *Attorney, Agent, or Firm* — McDonnell Boehnen Hulbert & Berghoff LLP

(57) ABSTRACT

Embodiments described herein provide for electrically reconfigurable deposition masks. One embodiment is a deposition mask that includes a plurality of electrical elements. Each of the electrical elements has an opening between a top surface and a bottom surface that constricts based on an electrical signal. A plurality of top surfaces of the electrical elements defines a top surface of the mask, and a plurality of bottom surface of the electrical elements defines a bottom surface of the mask.

22 Claims, 7 Drawing Sheets

ELECTRICALLY RECONFIGURABLE DEPOSITION MASKS

FIELD

This disclosure relates to the field of deposition masks for deposition manufacturing processes, such as Physical Vapor Deposition (PVD) processes and/or Chemical Vapor Deposition (CVD) processes.

BACKGROUND

PVD processes and CVD processes are used in the manufacture of micro and nano scale devices, such as integrated circuits. In PVD and CVD, structures are created by highly precise masks or templates. Various features are cut through the masks and the absence or presence of the features defines where deposition occurs on a substrate.

The masks are often quite thin (e.g., 10 nanometers to 30 micrometers). This makes it difficult to scale the masks to larger sizes without the risk of breaking and/or distorting the masks. Further, thermal expansion effects are multiplied as the masks increase in size, which increases the misplacement of the desired features onto the substrate. It is desirable to utilize larger masks to fabricate a larger number of devices simultaneously, because it reduces the per-device manufacturing costs.

SUMMARY

Embodiments described herein provide for electrically reconfigurable deposition masks. The masks include arrays of electrical elements that have openings through the elements that can be constricted and/or closed utilizing electrical signals. Using a reconfigurable mask, features to be deposited onto a substrate can be adjusted at will. For instance, the features on the mask can be adjusted to compensate for registration issues between the mask and the substrate, thermal expansion of the mask, etc.

One embodiment is a deposition mask that includes a plurality of electrical elements. Each of the electrical elements has an opening between a top surface and a bottom surface that is configured to constrict based on an electrical signal. A plurality of top surfaces of the electrical elements defines a top surface of the mask, and a plurality of bottom surfaces of the electrical elements defines a bottom surface of the masks.

Another embodiment is a method of operating an electrically reconfigurable deposition mask. The method comprises placing a deposition mask proximate to a substrate, where the mask includes a plurality of coplanar electrical elements. Each of the electrical elements has an opening between a top surface and a bottom surface that is configured to constrict based on an electrical signal. A plurality of top surfaces of the electrical elements defines a top surface of the mask, and a plurality of bottom surfaces of the electrical elements defines a bottom surface of the mask. The method further comprises applying the electrical signal to at least one electrical element to close the opening and to prevent a deposition material from passing through the opening. The method further comprises depositing material onto the substrate through openings in the mask.

Another embodiment is deposition mask that includes an array of coplanar piezoelectric devices that are organized into rows and columns. Each of the piezoelectric devices has a passage between a top surface and a bottom surface that is configured to close in response to an electrical signal received by the piezoelectric device. A plurality of top surfaces of the piezoelectric devices defines a top surface of the mask, and a plurality of bottom surfaces of the piezoelectric devices defines a bottom surface of the mask.

The above summary provides a basic understanding of some aspects of the specification. This summary is not an extensive overview of the specification. It is intended to neither identify key or critical elements of the specification nor delineate any scope of the particular embodiments of the specification, or any scope of the claims. Its sole purpose is to present some concepts of the specification in a simplified form as a prelude to the more detailed description that is presented later.

DESCRIPTION OF THE DRAWINGS

Some embodiments are now described, by way of example only, and with reference to the accompanying drawings. The same reference number represents the same element or the same type of element on all drawings

DESCRIPTION

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments, and are to be construed as being without limitation to such specifically recited examples and conditions. As a result, the inventive concept(s) is not limited to the specific embodiments or examples described below, but by the claims and their equivalents.

Figure 1:
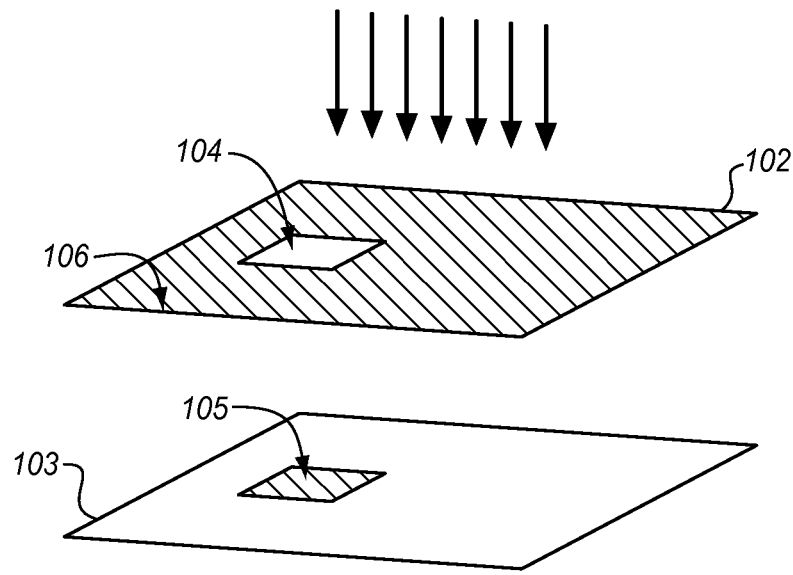
FIG. 1 illustrates a deposition mask.

FIG. 1 illustrates a deposition mask 102. Typically, mask 102 is laser cut or etched through and then aligned to a substrate 103. Portions of mask 102 that have been cut or etched away allow material from a deposition process to traverse a passage 104 through mask 102 and strike substrate 103 (e.g., a silicon wafer in cases of integrated circuit fabrication), forming a deposition feature 105. Although the mask 102 may be cleaned and re-used, mask 102 is fragile and easily damaged or broken. In addition, laser cutting or etching mask 102 is a permanent alteration to the configuration of mask 102. Thus, if mistakes are made or changes are desired in the configuration of mask 102, then mask 102 is discarded and a new mask is fabricated.

When mask 102 is large, thermal expansion may render mask 102 unusable during the fabrication process due to temperature changes. For instance, if the desired features on mask 102 have a registration tolerance to substrate 103 of a few microns, then features near the edges (e.g., deposition feature 105) of mask 102 may be misaligned to substrate 103 as mask 102 expands. This may preclude the ability to use larger masks during fabrication, which limits the number of devices that may be simultaneously fabricated with mask 102, thereby increasing the per-device fabrication cost. Further, when different masks are utilized during fabrication, it may be difficult to ensure that each mask is registered correctly to substrate 103. This may result in registration problems between masks and substrate 103, which may distort or smear the features deposited on substrate 103.

Figure 2:
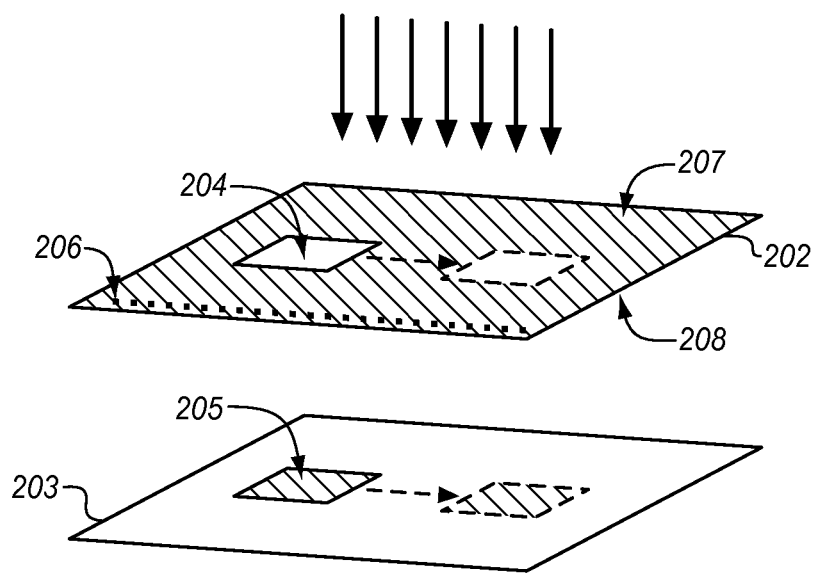
FIG. 2 illustrates an electrically reconfigurable deposition mask in an exemplary embodiment.

FIG. 2 is an electrically reconfigurable deposition mask 202 in an exemplary embodiment. In this embodiment, mask 202 is utilized for a deposition process. For instance, mask 202 may be utilized in a CVD process and/or a PVD process to fabricate integrated circuits. Mask 202 includes a passage 204 that traverses mask 202 from an exterior top surface 207 of mask 202 to an exterior bottom surface 208 of mask 202. Passage 204 allows a deposition material (not shown) to strike a substrate 203 and form a deposition feature 205. Portions of mask 202 that do not include passage 204 block the material from striking substrate 203.

In the embodiments described herein, mask 202 is electrically reconfigurable. Various electrical signals may be applied to mask 202, which modify electrical elements 206 that are used to form mask 202. Only a few instances of electrical elements 206 are shown in FIG. 2 for clarity. However, mask 202 may include any number of electrical elements 206 as a matter of design choice. For instance, mask 202 may be formed entirely from electrical elements 206, may be formed partially from electrical elements 206, etc. In this embodiment, electrical elements 206 include a passage or window that can be constricted or closed as desired utilizing electrical signals, thereby allowing for a control of where material for a deposition process is applied to substrate 203.

For instance, passage 204 may be formed by allowing a subset of electrical elements 206 in mask 202 to remain open. Further, passage 204 may be moved relative to substrate 203, as illustrated by the arrow along mask 202 in FIG. 2, by modifying which subset of electrical elements 206 present in mask 202 remains open. This alters a location of deposition feature 205 on substrate 203, as illustrated by the arrow along substrate 203 in FIG. 2. Because mask 202 is electrically reconfigurable, the deposition features applied to substrate 203 can be adjusted as desired. For instance, deposition feature 205 may be made smaller, larger, of a different shape, of a different position, etcetera, without fabricating a new mask. This is performed by reconfiguring which of electrical elements 206 in mask 202 remain open, and which of electrical elements 206 in mask 202 remain closed. Further, because mask 202 is electrically reconfigurable, mask 202 may be reconfigured during different manufacturing steps (e.g., while depositing different layers of an integrated circuit) without re-registering mask 202 to substrate 203. This reduces the possibility of registration errors between mask 202 and substrate 203 and improves fabrication processes that utilize reconfigurable deposition masks, such as mask 202.

Figure 3A:
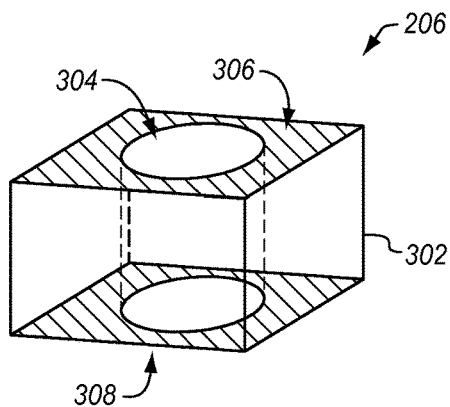
FIG. 3A is an isometric view of an electrical element utilized to form an electrically reconfigurable deposition mask in an exemplary embodiment.

FIG. 3A is an isometric view of electrical element 206 utilized to form mask 202 in an exemplary embodiment. In this view, electrical element 206 has an opening 304 that traverses through a block 302 of material. Using electrical signals, opening 304 may be shrunk, reduced, constricted, etcetera, as desired. Therefore, opening 304 may be fully open, partially open, closed, or may exist within any condition between fully open and fully closed by modifying electrical signals applied to electrical element 206. In this view, opening 304 is substantially open.

Electrical element 206 in FIG. 3A has a top surface 306 that corresponds to top surface 207 of mask 202. Further, electrical element 206 in FIG. 3A has a bottom surface 308 that corresponds to bottom surface 208 of mask 202. Block 302 may be formed from any material that is able to change shape based on an electrical signal. For instance, block 302 may be formed from a piezoelectric material which expands or contracts when subjected to a current, thereby constricting or expanding opening 304. Some examples of piezoelectric materials include barium titanate ($BaTiO_3$), lead titanate ($PbTiO_3$), lead zirconate titanate ($Pb[Zr_xTi_{1-x}]O_3$ $0 \leq x \leq 1$), potassium niobate ($KNbO_3$), lithium niobate ($LiNbO_3$), lithium tantalate ($LiTaO_3$), sodium tungstate ($Na_2WO_3$), zinc oxide ($ZnO$), $Ba_2NaNb_5O_5$, $Pb_2KNb_5O_{15}$, bismuth ferrite ($BiFeO_3$), sodium niobate ($NaNbO_3$), bismuth titanate ($Bi_4Ti_3O_{12}$), sodium bismuth titanate ($Na_{0.5}Bi_{0.5}TiO_3$), and polyvinylidene fluoride (PVDF). However, one skilled in the art will recognize that other piezoelectric materials may be utilized to form block 302 as a matter of design choice.

Although electrical element 206 in FIG. 3A has been illustrated as being substantially rectangular in shape, one skilled in the art will recognize that the particular shape, orientation, and/or relative dimensions illustrated in FIG. 3A are a matter of design choice. Further, opening 304 may be substantially rounded, square, an ellipse, or any other configuration as a matter of design choice.

Figure 3B:
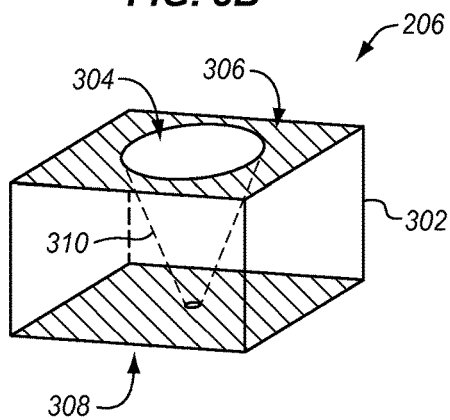
FIG. 3B is an isometric view of the electrical element of FIG. 3A in a closed state in an exemplary embodiment.

FIG. 3B is an isometric view of electrical element 206 of FIG. 3A in a closed state in an exemplary embodiment. In this embodiment, opening 304 through top surface 306 of block 302 tapers down to form a cone 310 that blocks a deposition material from passing through electrical element 206. When electrical element 206 is closed in this embodiment (e.g., in response to the application of an electrical signal to electrical element 206), cone 310 tapers from a larger opening along top surface 306 towards a smaller or completely closed opening along bottom surface 308.

Figure 3C:
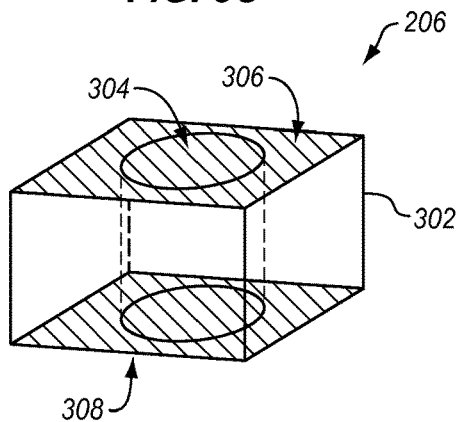
FIG. 3C is an isometric view of the electrical element of FIG. 3A in a closed state in another exemplary embodiment.

FIG. 3C is an isometric view of electrical element 206 of FIG. 3A in a closed state in another exemplary embodiment. In this embodiment, top surface 306 of block 302 is substantially or completely closed, which blocks a deposition material from passing through electrical element 206.

Figure 4:
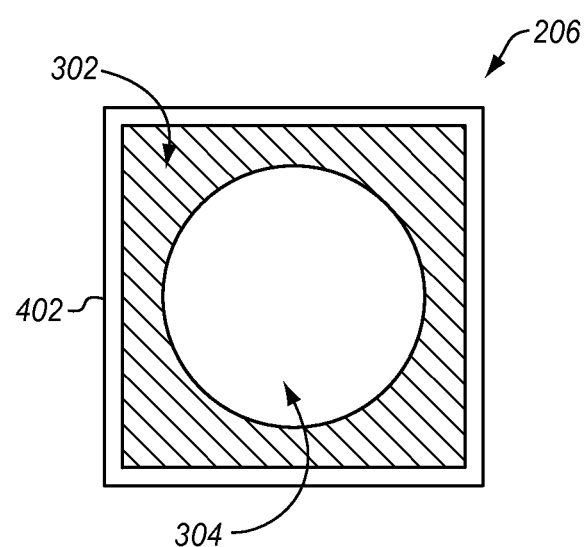
FIG. 4 is a top view of the electrical element of FIG. 3A in an exemplary embodiment.

FIG. 4 is a top view of electrical element 206 in an exemplary embodiment. In this embodiment, block 302 of material is surrounded by an insulator 402 along the sides of block 302. Some examples of insulator 402 includes polyethylene, cross-linked polyethylene, PolyVinyl Chloride, ceramic, Kapton®, rubber-like polymers, oil impregnated paper, Teflon®, silicone, and modified ethylene tetrafluoroethylene (ETFE). However, one skilled in the art will recognize that other insulating materials may be utilized to form insulator 402 as a matter of design choice.

When mask 202 is fabricated from a plurality of electrical elements 206, insulator 402 may be utilized to electrically isolate one instance of electrical element 206 in mask 202 from another, although other configurations may exist (e.g., entire rows of electrical elements 206 may share the same driving signal for controlling the constriction of opening 304). When a current is applied to block 302, the material used to form block 302 may swell or contract and cause opening 304 to reduce in diameter or expand in diameter, respectively. For instance, if block 302 is formed from a material that swells or expands in response to an application of current to electrical element 206, then opening 304 may have a larger diameter when the current applied to block 302 is low, non-existent, or below some threshold value. In this case, the application of a current to block 302 (e.g., above some threshold value) causes the material in block 302 to swell, which constricts opening 304. Opening 304 may be constricted sufficiently to block a deposition material from passing through opening 304. For instance, opening 304 may be closed entirely or substantially. This prevents a deposition material from traversing through opening 304 and contacting substrate 203 (see FIG. 2).

If, for instance, block 302 is formed from a material that shrinks or contracts in response to an application of current, then opening 304 may be present when the current applied to block 302 is high or above some threshold value. With little or no current applied to block 302, opening 304 may be closed or substantially closed. In this case, the reduction of a current to block 302 (e.g., below some threshold value) causes the material in block 302 to shrink, which expands opening 304. Opening 304 may be expanded sufficiently to allow a deposition material to pass through opening 304. This allows a deposition material to traverse through opening 304 and contact substrate 203 (see FIG. 2).

Figure 5A:
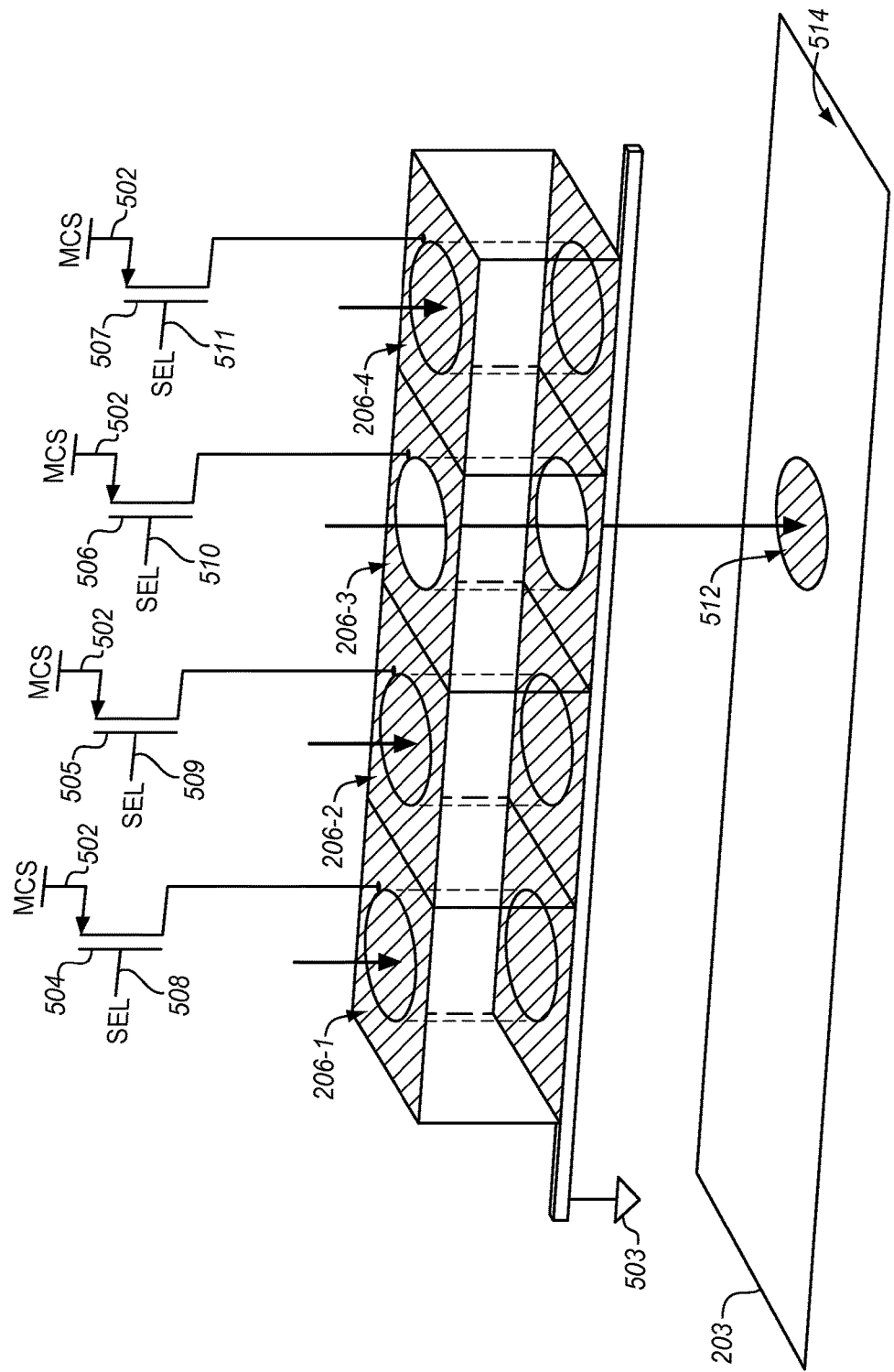
FIG. 5A is an isometric view of an array of electrical elements including transistor drivers that are utilized to form an electrically reconfigurable deposition mask in an exemplary embodiment.

FIG. 5A is an isometric view of an array of electrical elements 206 including transistor drivers 504-507 that are utilized to form mask 202 in an exemplary embodiment. In this embodiment, a mask current source 502 selectively provides current to electrical elements 206-1 to 206-4 based on select signals 508-511. Electrical elements 206 share a common ground 503, which is a return path for source 502. However, other configurations of electrical elements 206 may exist. For example, electrical elements 206 may be common to source 502, with each having a pull-down transistor coupled to ground 503. In this embodiment, transistors 504-507 are illustrated as P-channel Field Effect Transistors (FETs), although other configurations are possible.

With select signals 508-509 and 511 low, FETs 504-505 and 507 are on. Source 502 provides current to each of electrical elements 206-1, 206-2, and 206-4. When electrical elements 206 are fabricated with materials that swell in response to an applied current, passages 204 for each of elements 206-1, 206-2, and 206-4 are closed. This is illustrated in FIG. 5A by a lack of deposition material being applied to substrate 203 directly under electrical elements 206-1, 206-2, and 206-4. With select signal 510 high, FET 506 is off. Source 502 does not supply current to electrical element 206-3, and opening 304 for electrical element 206-3 remains open. This is illustrated in FIG. 5A by deposition material being applied to substrate 203 directly under electrical element 206-3.

In some embodiments, mask 202 is formed utilizing an array of electrical elements 206, each configured to be addressable independently or substantially independently. In these embodiments, individual electrical elements 206 may remain open or be closed at will, which provides reconfiguration capabilities for mask 202. For instance, if it is desired to move a deposition feature 512 relative to an edge 514 of substrate 203 (e.g., to resolve a registration issue and/or a thermal expansion issue), then it is possible to selectively open a nearby electrical element (e.g., electrical element 206-2) and to close electrical element 206-3, with the result being that deposition feature 512 will move to the left in FIG. 5A relative to edge 514 of substrate 203. This provides a substantial improvement over mask 102 of FIG. 1, which is permanently laser cut or etched.

Figure 5B:
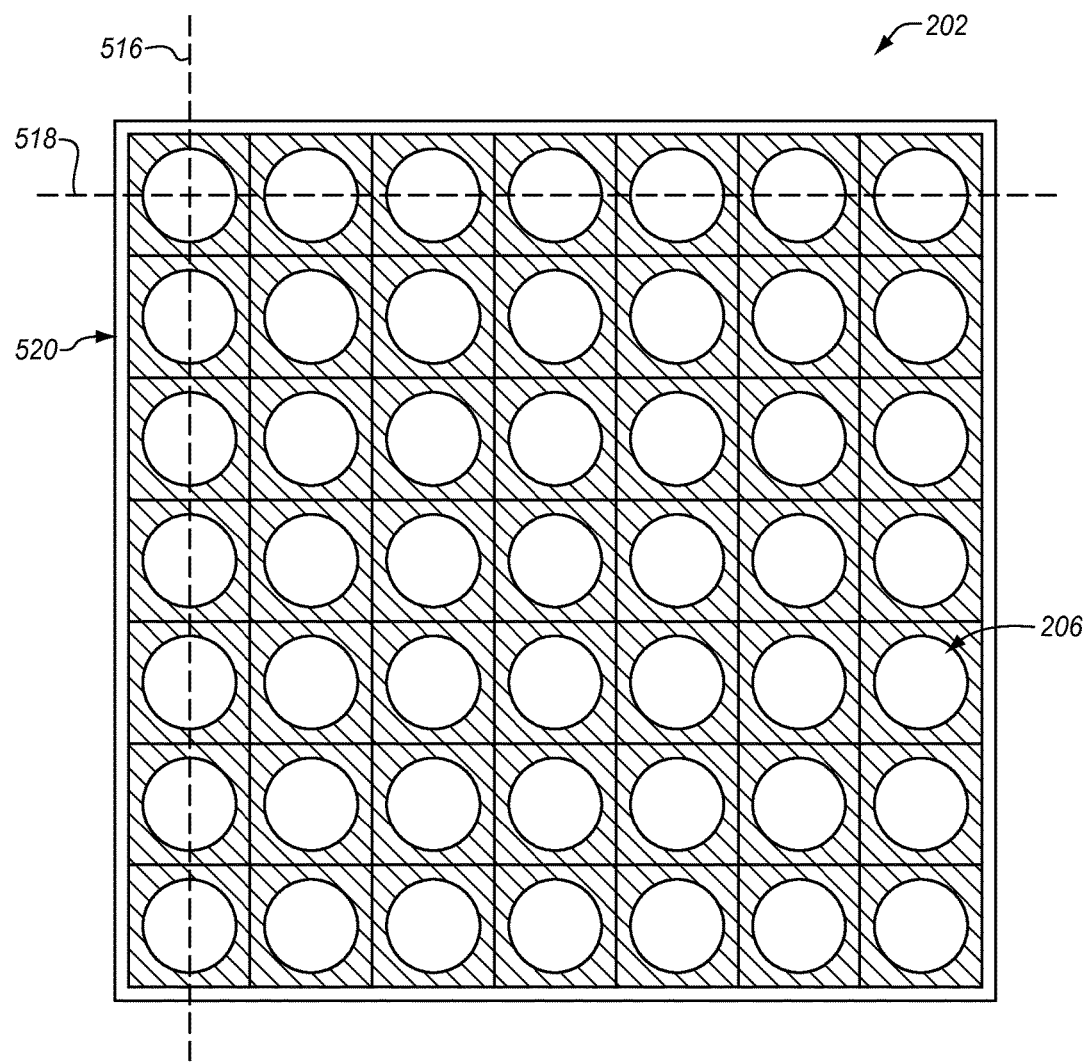
FIG. 5B is a top view of electrical elements in a column and row configuration that are utilized to form an electrically reconfigurable deposition mask in an exemplary embodiment.

FIG. 5B is a top view of electrical elements 206 in a column 516 and row 518 configuration that are utilized to form an electrically reconfigurable deposition mask in an exemplary embodiment. In this embodiment, a plurality of electrical elements 206 are assembled in columns 516 and rows 518 to form mask 202. Although electrical elements 206 are illustrated in a 7×7 configuration in this view, any number or configuration of electrical elements 206 may be utilized to form mask 202. In this embodiment, electrical elements 206 are assembled within a frame 520, which holds electrical elements 206 in place. However, in some embodiments, electrical elements 206 may be bonded together, stitched together, glued together, sonically welded together, etcetera, as a matter of design choice.

Figure 6:
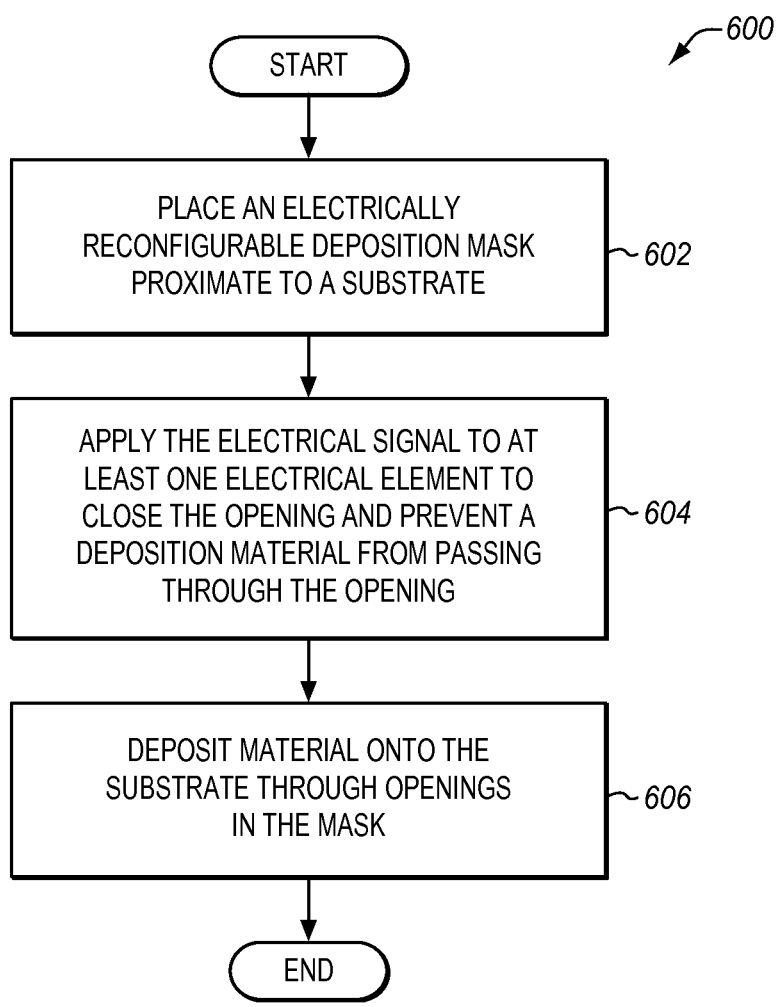
FIG. 6 is a flow chart of a method of utilizing an electrically reconfigurable deposition mask for a deposition process in an exemplary embodiment.

FIG. 6 is a flow chart of a method 600 of utilizing mask 202 for a deposition process in an exemplary embodiment. The steps of method 600 will be described with respect to mask 202 and electrical element 206 of FIGS. 2-5; although one skilled in the art will understand that method 600 may apply to other reconfigurable masks not shown. The steps of method 600 are not all inclusive and may include other steps not shown.

For a deposition process (e.g., a CVD or a PVD process), mask 202 is placed proximate to substrate 203 (see step 602 of FIG. 6). Various portions of mask 202 are selectively opened utilizing one or more control signals (e.g., select signals 508-511 of FIG. 5A) to form the desired deposition features (e.g., feature 512) onto substrate 203 (see step 604 of FIG. 6). For instance, electrical elements 206-1, 206-2, and 206-4 are closed, which prevents a deposition material from striking substrate 203. Material is then deposited onto substrate 203 through openings 304 of electrical elements 206 (e.g., electrical element 206-3) that are utilized to form mask 202 (see step 606 of FIG. 6).

Figure 7:
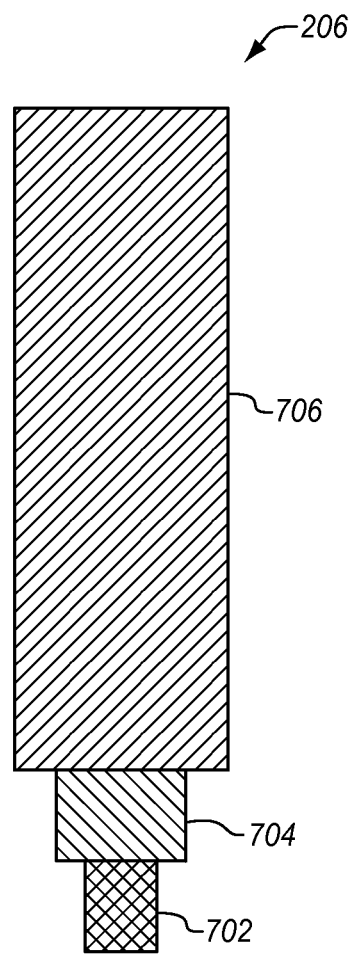
FIG. 7 is a side view of an electrical element utilized to form an electrically reconfigurable deposition mask during a fabrication process in an exemplary embodiment.

FIG. 7 is a side view of an electrical element 206 utilized to form mask 202 during a fabrication process in an exemplary embodiment. FIG. 7 and the following discussion describe just one possible process for fabricating electrical elements 206, and one skilled in the art will recognize that other processes may exist.

In this embodiment, electrical element 206 may be formed by coating an optical fiber 702 with a piezoelectric material 704. The fiber 702 may be silicon or plastic. Fiber 702, now coated with piezoelectric material 704, may then be coated with an insulator 706. Fiber 702, now coated with both piezoelectric material 704 and insulation 706, is sliced into blocks. Fiber 702 is etched away, leaving an opening in the block. The result is electrical elements 206 illustrated in FIGS. 3-4. Electrical elements 206 may then be assembled into coplanar arrays that form mask 202. Electrical connections may then be made to electrical elements 206, now assembled into mask 202 (e.g., as illustrated in FIG. 5A and FIG. 5B).

Although specific embodiments were described herein, the scope is not limited to those specific embodiments. Rather, the scope is defined by the following claims and any equivalents thereof.

The invention claimed is:

1. An apparatus, comprising:
a deposition mask comprising a plurality of coplanar electrical elements, each having a passage within the electrical element and between a top surface and a bottom surface of the electrical element, the passage of the electrical element being configured to physically constrict based on an electrical signal,
wherein a plurality of top surfaces of the electrical elements defines define a top surface of the deposition mask, wherein a plurality of bottom surfaces of the electrical elements define a bottom surface of the deposition mask; and
a plurality of transistors electrically coupled to the plurality of coplanar electrical elements, wherein a respective transistor is configured to vary a current applied to a respective coplanar electrical element to generate the electrical signal.

2. The apparatus of claim 1, wherein:
the passage for at least one of the plurality of coplanar electrical elements is configured to physically close in response to the electrical signal to prevent a deposition material from passing through the passage.

3. The apparatus of claim 1, wherein:
the plurality of coplanar electrical elements are piezoelectric devices.

4. The apparatus of claim 3, wherein:
each piezoelectric device comprises:
 a block of piezoelectric material having the passage disposed between a top surface of the block of piezoelectric material and a bottom surface of the block of piezoelectric material: and
 an insulation material disposed along sides of the block of piezoelectric material.

5. The apparatus of claim 1, further comprising:
an insulator between each of the plurality of coplanar electrical elements that is configured to electrically isolate the plurality of coplanar electrical elements from each other.

6. The apparatus of claim 1, wherein:
physically constricting the passage comprises tapering an opening al the top surface of the deposition mask to form a cone that closes the passage at the bottom surface of the deposition mask.

7. The apparatus of claim 1, wherein the top surface of the electrical element is configured to physically constrict a first amount and the bottom surface of the electrical element is configured to physically constrict a second amount, wherein the first amount is different than the second amount.

8. A deposition mask, comprising:
an array of coplanar piezoelectric devices organized in rows and columns, each piezoelectric device having a passage within the piezoelectric device and between a top surface and a bottom surface of the piezoelectric device, the passage of the piezoelectric device configured to physically constrict in response to an electrical signal received by the piezoelectric device,
wherein a plurality of top surfaces of the piezoelectric devices define a top surface of the deposition mask, and wherein a plurality of bottom surfaces of the piezoelectric devices define a bottom surface of the deposition mask.

9. The deposition mask of claim 8, wherein:
each piezoelectric device comprises:
 a block of piezoelectric material having the passage disposed between a top surface of the block of piezoelectric material and a bottom surface of the block of piezoelectric material; and
 an insulation material disposed along sides of the block of piezoelectric material.

10. The deposition mask of claim 9, further comprising:
a transistor electrically coupled to the block of piezoelectric material that is configured to apply a current to the block of piezoelectric material to generate the electrical signal.

11. The deposition mask of claim 10, further comprising:
a ground connection electrically coupled to the block of piezoelectric material that is configured as a return path for the current applied to the block of piezoelectric material.

12. The deposition mask of claim 10, further comprising:
an array of transistors, each coupled to one piezoelectric device and configured to vary a current applied to the block of piezoelectric material for a corresponding piezoelectric device to generate a corresponding one of a plurality of electrical signals.

13. The deposition mask of claim 8, further comprising:
an insulator between the array of coplanar piezoelectric devices that is configured to electrically isolate the array of coplanar piezoelectric devices from each other.

14. The deposition mask of claim 8, wherein:
physically constricting the passage comprises tapering an opening at the top surface of the deposition mask to form a cone that closes the passage at the bottom surface of the deposition mask.

15. The deposition mask of claim 1, wherein each of the plurality of coplanar electrical elements are independently controllable.

16. A deposition mask, comprising:
a plurality of coplanar piezoelectric devices, each having a passage within the piezoelectric device between a top surface and a bottom surface of the piezoelectric device, the passage of the piezoelectric device being configured to physically constrict based on an electrical signal,
wherein a plurality of top surfaces of the piezoelectric devices define a top surface of the deposition mask, wherein a plurality of bottom surfaces of the piezoelectric devices define a bottom surface of the deposition mask.

17. A deposition mask, comprising:
a plurality of coplanar electrical elements, each comprising:
 a block of piezoelectric material having a passage disposed within the piezoelectric device and between a top surface of the block of piezoelectric material and a bottom surface of the block of piezoelectric material; and
 an insulation material disposed along sides of the block of piezoelectric material, wherein the passage is configured to physically constrict based on an electrical signal,
wherein a plurality of top surfaces of the electrical elements define a top surface of the deposition mask, wherein a plurality of bottom surfaces of the electrical elements define a bottom surface of the deposition mask.

18. A method of operating an electrically re-configurable deposition mask, the method comprising:
placing the electrically re-configurable deposition mask to be proximate to a substrate, wherein the electrically re-configurable deposition mask includes a plurality of coplanar electrical elements each having a passage within the electrical element and between a top surface and a bottom surface of the electrical element that is configured to physically constrict based on an electrical signal, wherein a plurality of top surfaces of the electrical elements define a top surface of the electrically re-configurable deposition mask, and wherein a plurality of bottom surfaces of the electrical define a bottom surface of the electrically re-configurable deposition mask;

varying a current applied to a respective coplanar electrical element by utilizing a transistor electrically coupled to the plurality of coplanar electrical element to generate the electrical signal;

applying the electrical signal to at least one of the plurality of coplanar electrical elements to physically constrict the passage and prevent a deposition material from passing through the passage; and depositing material onto the substrate through open passages in the electrically reconfigurable deposition mask.

19. The method of claim 18, wherein:
the plurality of coplanar electrical elements are piezoelectric devices.

20. The method of claim 19 wherein:
each piezoelectric device comprises:
  a block of piezoelectric material having the passage disposed between a top surface of the block of piezoelectric material and a bottom surface of the block of piezoelectric material; and
  an insulation material disposed along sides of the block of piezoelectric material.

21. The method of claim 18, wherein depositing further comprises:
performing a Chemical Vapor Deposition (CVD) process to deposit the deposition material onto the substrate.

22. The method of claim 18, wherein depositing further comprises:
performing a Physical Vapor Deposition (PVD) process to deposit the deposition material onto the substrate.

* * * * *